United States Patent [19]
Romine

[11] 4,219,251
[45] Aug. 26, 1980

[54] POWER CONNECTOR

[75] Inventor: Edward L. Romine, Meriden, Conn.

[73] Assignee: Litton Systems, Inc., Oakville, Conn.

[21] Appl. No.: 967,692

[22] Filed: Dec. 8, 1978

[51] Int. Cl.[3] .................................... H05K 1/08
[52] U.S. Cl. .................... 339/17 C; 339/195 M
[58] Field of Search ............ 339/17 R, 17 C, 18 P, 339/198, 151 M, 176 MP, 195 M, 196; 361/413

[56] References Cited

U.S. PATENT DOCUMENTS

| | | | |
|---|---|---|---|
| 3,243,760 | 3/1966 | Dupre et al. | 339/17 R X |
| 3,624,588 | 11/1971 | Farmer | 339/17 C |
| 4,012,095 | 3/1977 | Doucet et al. | 339/17 C |
| 4,017,143 | 4/1977 | Knowles | 339/17 C X |
| 4,027,128 | 5/1977 | Walker | 339/17 R X |

*Primary Examiner*—Howard N. Goldberg
*Assistant Examiner*—Eugene F. Desmond
*Attorney, Agent, or Firm*—Brian L. Ribando

[57] ABSTRACT

A power connector for a printed circuit board comprises a plastic body and a conductive plate disposed on the top surface thereof. Conductive pin contacts pass through the body and are attached by solder to the conductive plate. The pins connect to the printed circuit board and a power lead may be coupled to the conductive plate by a screw.

10 Claims, 3 Drawing Figures

POWER CONNECTOR

BACKGROUND OF THE INVENTION

The invention relates to a power connector for a printed circuit board.

A power connector is often required to bring and distribute power to a printed circuit board. Pin contacts may be provided to allow a solderless connection to plated through holes in the printed circuit board, and the pins can be attached to the power connector by soldering. The connector may then be pressed into the printed circuit board and acts as a bus. Power may be fed to the connector from a lead wire by wire wrapping or with a ring or spade terminal which may be fastened to the connector by the use of a screw.

Former power connector assemblies comprise a body consisting of solid brass or other conductive metal. The brass body is difficult to manufacture and is expensive. Further, soldering the pin contacts to the brass body is often difficult since the body acts as a heat sink.

SUMMARY AND OBJECTS OF THE INVENTION

The power connector of the present invention comprises a body consisting of plastic utilized in combination with a conductive metal plate to which pin contacts may be attached. These pins pass through the plastic body and may be used to couple the connector to a printed circuit board in a known way. The conductive plate is provided with a threaded aperture which receives a screw to couple the spade terminal of a power lead thereto. Means may be provided on the plastic body to prevent rotation of the conductive plate relative thereto and to prevent rotation of the spade terminal when the screw is being attached. The plastic body may be provided with dowel pins which mate with holes in the printed circuit board to relieve the bending and shear stress which would otherwise be developed on the connection pins.

It is therefore an object of the invention to provide a power connector for a printed circuit board comprising a plastic body and a conductive plate attached thereto.

It is another object of the invention to provide a power connector for a printed circuit board comprising a plastic housing having pin contacts which mate with the circuit board and a conductive plate having a threaded aperture for receiving a fastening means used to attach a power lead thereto.

These and other objects of the invention will become apparent from the following detailed description taken in conjunction with the accompanying drawing figures in which like reference numerals designate like or corresponding parts throughout the figures.

DESCRIPTION OF THE PREFERRED EMBODIMENT

Figure 1:
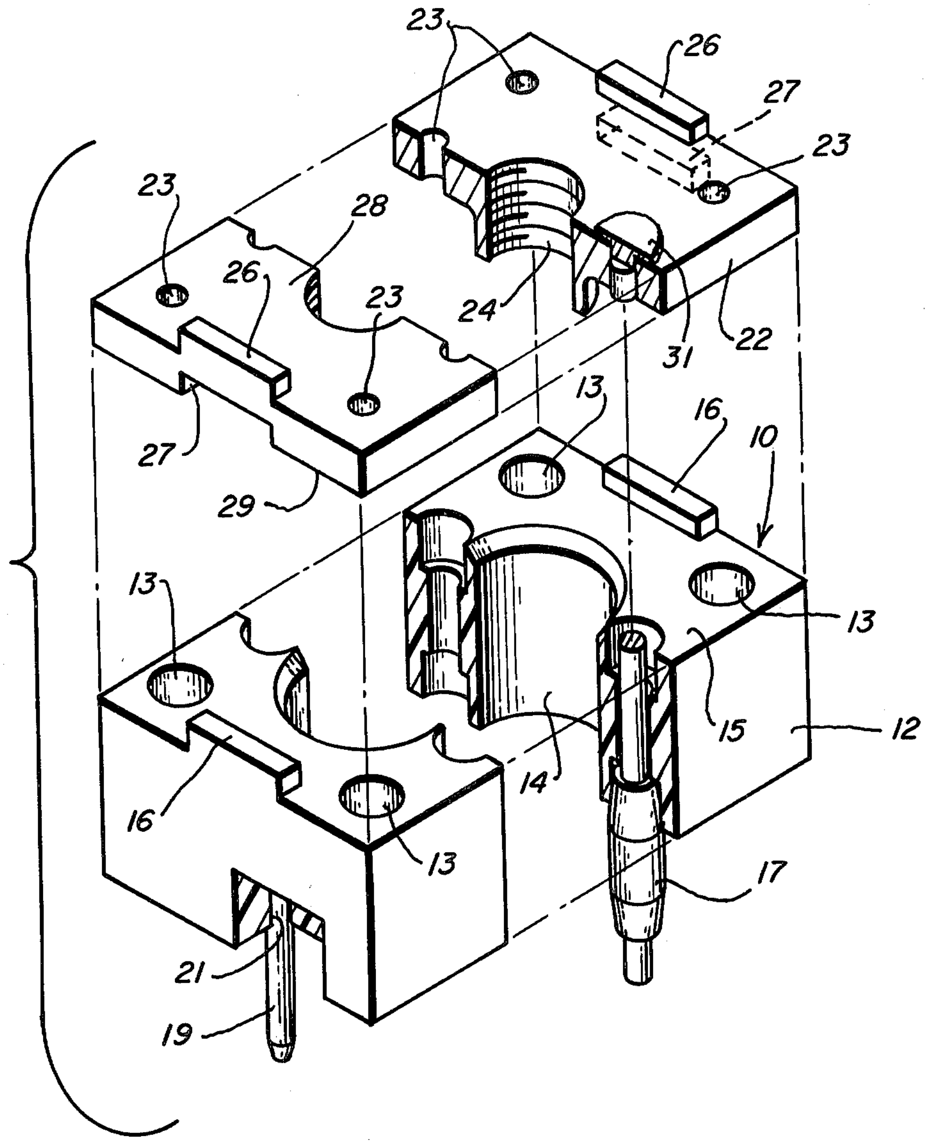
FIG. 1 is an exploded perspective view, partly in section, of a power connector according to the invention.

Referring now to the drawings, there is shown in FIG. 1 a power connector generally designated by the reference numeral 10. The power connector 10 comprises a plastic body 12 having a plurality of connector pin receiving apertures 13 formed therein. In the middle of the body 12 is a large central aperture 14, and the top surface 15 of the housing is provided on each of two sides with a raised rectangular boss 16. A plurality of pin contacts 17 may be received by the apertures 13 to extend above the top surface 15 thereof. It should be understood that the pin contacts 17 themselves constitute no portion of the present invention and that contacts such as shown in U.S. Pat. No. 4,017,143, assigned to the Assignee of the instant invention, may be suitably employed therefore. A plurality of dowel pins 19 may be secured in dowel pin apertures 21 to protrude from the underside of the body 12.

A conductive plate 22 is dimensioned to cover the upper surface of the plastic body 12 and comprises a number of apertures 23 equal in number to the apertures 13 which are in substantial alignment therewith. The top portions of the pin contacts 17 are received by the apertures 23 and a conductive means 31 such as solder may be used to electrically and mechanically couple the pin contacts to the plate 22. The plate 22 also comprises a threaded central bore 24 which is in alignment with the central bore 14 of the plastic body 12. A pair of steps 26 may be formed on the upper surface 28 of the plate 22 and a pair of detents 27 may be formed on the lower surface 29. It will be seen that the detents 27 are in alignment with the bosses 16 and that when assembled, relative rotation between the plate 22 and the body 12 is prevented thereby.

Figure 2:
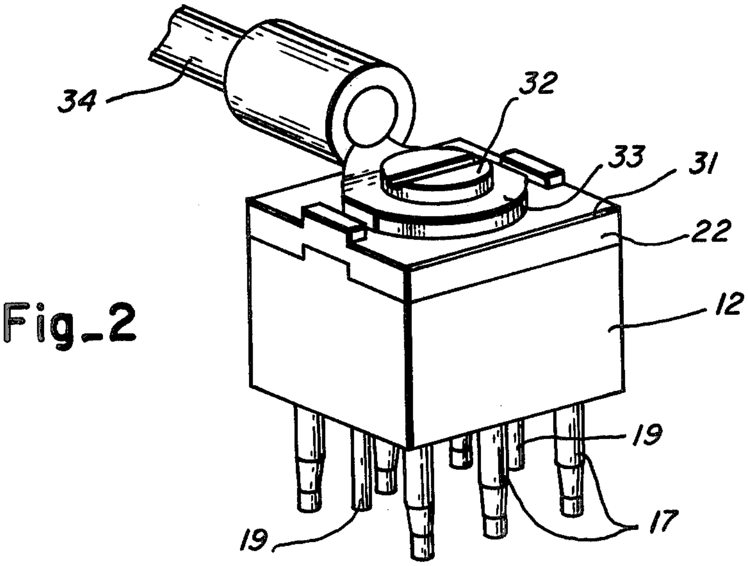
FIG. 2 is a perspective view of the power connector of FIG. 1 with a power lead attached.

Turning now to FIG. 2, a power connector according to the invention in a fully assembled state is shown. A threaded fastener 32 may be used to couple a terminal portion 33 of a power lead 34 to the plate 22 by engagement with the threaded central bore 24.

Figure 3:
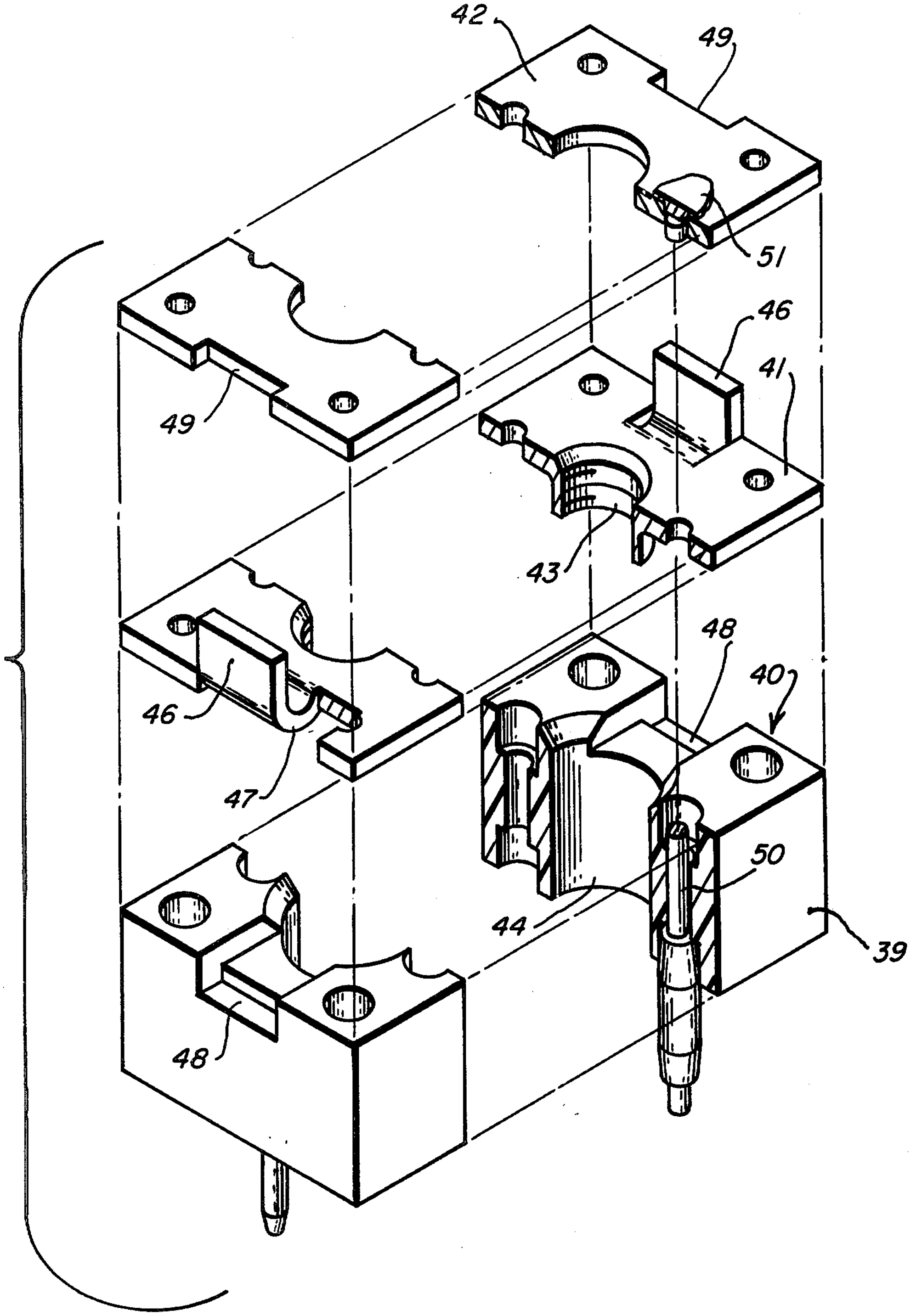
FIG. 3 is a sectional view of an alternative embodiment of the power connector of FIG. 1.

Turning now to FIG. 3, an alternate embodiment of the invention is shown. The connector 40 comprises a plastic body 39, a bottom plate 41 and a top plate 42. The bottom plate 41 is formed with a threaded central aperture 43 which mates with the central bore 44 of the connector 40 and includes upstanding lugs 46. Depressed knee portions 47 of the lugs 46 mate with a groove 48 which is formed in the body 39 and this mating engagement prevents relative rotation between the plate 41 and the body. The top plate 42 is additionally formed with a pair of notches 49 which receive the upstanding lugs 46 to prevent relative rotation between the top plate 42 and the bottom plate 41. Solder 51 applied to the top plate 42 will couple the ends of pin contacts 50 thereto and will retain the body 39 and the plates 41 and 42 in assembled relationship.

The use of the power connector according to the invention will be apparent to those skilled in the art. The array of pin contacts 17 allow the connector to be press connected to the plated through holes of a printed circuit board. Once the connector is in place, the terminated end of a power lead may be coupled thereto through the use of a threaded fastener. The mechanical interfitting of the projections and recesses in the top of the connector body and the conductive plate prevent relative rotation therebetween and avoid stresses which would otherwise be applied to the solder connections between the top plate and the pin contacts. The projections on the top of the conductive plate prevent the rotation of the termination on the power lead. Additionally, the dowel pins, if mated with matching apertures in the circuit board, prevent strain of the pin contacts caused by the tightening of the threaded fastener.

Having described the invention, various modifications and alterations will occur to those skilled in the art, which modifications and alterations are intended to be within the scope of the present invention as defined in the appended claims.

I claim:

1. A power connector for use in coupling the terminal end of a power lead to the plated through holes of a printed circuit board, the power connector comprising:
   - a unitary, block-shaped plastic body having a first array of apertures therethrough extending from a first side to a second opposing side,
   - a conductive plate having a second array of apertures therein,
   - integrally formed interfitting engagement means on said first side of said plastic body and on said conductive plate for preventing relative rotational movement therebetween,
   - a plurality of pin contacts disposed one each in said first array of apertures, all of said pin contacts protruding on one end into said second array of apertures and all of said pin contacts protruding on the opposite end from said second side of said plastic body for mating with said plated through holes such that said second side of said plastic body is contiguous with the printed circuit board when mated therewith,
   - means electrically connecting said pin contacts to said conductive plate, and
   - conductive fastening means for connecting said plate with said terminal end.

2. The power connector of claim 1 further comprising:
   - a threaded fastener comprising said conductive fastening means, and
   - a threaded aperture in said conductive plate for receiving said threaded fastener.

3. The power connector of claim 2 further comprising:
   - steps on said conductive plate on opposite sides of said threaded aperture for preventing rotation of said terminal end relative to said conductive plate.

4. The power connector of claim 1 further comprising:
   - apertures in said plastic body for receiving dowel pins, and
   - a dowel pin disposed in each of said apertures to protrude from said plastic body, whereby said dowel pins mate with said circuit board to prevent relative rotation between said plastic body and said circuit board.

5. The power connector of claim 1 further comprising:
   - a boss on said plastic body and a detent on said conductive plate comprising said engagement means.

6. A power connector for use in coupling the terminal end of a power lead to the plated through holes of a printed circuit board, the power connector comprising:
   - a plastic body having a first array of apertures therethrough,
   - a top conductive plate having a second array of apertures therethrough,
   - a bottom conductive plate having a third array of appertures therethrough,
   - a plurality of pin contacts disposed one each in said first array of apertures, said pin contacts protruding on one end through said third array of apertures and into said second array of apertures and protruding on the opposite end from the plastic body for mating with said plated through holes,
   - means electrically connecting said pin contacts with said conductive plates, and
   - conductive fastening means for connecting said conductive plates with said terminal end.

7. The power connector of claim 6 further comprising:
   - engagement means on said plastic body and on each of said conductive plates for preventing relative rotational motion therebetween.

8. The power connector of claim 7 further comprising:
   - a threaded fastener comprising said conductive fastening means, and
   - a threaded aperture in one of said conductive plates for receiving said threaded fastener.

9. The power connector of claim 8 further comprising:
   - upstanding lugs on said bottom conductive plate having depressed knee portions,
   - grooves in said plastic body which receive said depressed knee portions, and
   - notches in said top conductive plate for receiving said upstanding lugs, said grooves, notches and upstanding lugs comprising said engagement means.

10. The power connector of claim 9 wherein said threaded aperture is in said bottom conductive plate.

* * * * *